US012367326B1

(12) United States Patent
Gabrovski et al.

(10) Patent No.: US 12,367,326 B1
(45) Date of Patent: *Jul. 22, 2025

(54) REALISM METRIC FOR TESTING SOFTWARE FOR CONTROLLING AUTONOMOUS VEHICLES

(71) Applicant: Waymo LLC, Mountain View, CA (US)

(72) Inventors: Aleksandar Gabrovski, Mountain View, CA (US); Yang-Hua Chu, Menlo Park, CA (US); James Stout, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 1002 days.

This patent is subject to a terminal disclaimer.

(21) Appl. No.: 17/409,935

(22) Filed: Aug. 24, 2021

Related U.S. Application Data

(63) Continuation of application No. 16/108,702, filed on Aug. 22, 2018, now Pat. No. 11,126,763.

(51) Int. Cl.
*G06F 30/20* (2020.01)
*G05D 1/00* (2024.01)

(52) U.S. Cl.
CPC .......... *G06F 30/20* (2020.01); *G05D 1/0088* (2013.01); *G05D 1/0246* (2013.01)

(58) Field of Classification Search
CPC ..... G06F 30/20; G05D 1/0088; G05D 1/0246
See application file for complete search history.

(56) References Cited

U.S. PATENT DOCUMENTS

| 8,019,447 | B2 | 9/2011 | Hoisington et al. | |
|---|---|---|---|---|
| 8,527,199 | B1 | 9/2013 | Burnette et al. | |
| 9,612,123 | B1 | 4/2017 | Levinson et al. | |
| 2017/0147722 | A1 | 5/2017 | Greenwood | |
| 2017/0248494 | A1* | 8/2017 | Miller | G01N 15/0656 |
| 2017/0372431 | A1* | 12/2017 | Perl | G07C 5/008 |
| 2018/0086344 | A1 | 3/2018 | Zhu et al. | |

OTHER PUBLICATIONS

Rich Taylor; "Travel Time Reliability: Making It There on Time, All the Time" from US department of Transportation (Year: 2005).*
Aaron Kane et al.; "A Case Study on Runtime Monitoring of an Autonomous Research Vehicle (ARV) System"; International Conference on Runtime Verification (2015) (Year: 2015).*

(Continued)

*Primary Examiner* — Rehana Perveen
*Assistant Examiner* — Nupur Debnath
(74) *Attorney, Agent, or Firm* — Botos Churchill IP Law

(57) ABSTRACT

The disclosure relate to determining a realism metric for testing software for operating a vehicle in an autonomous driving mode. For instance, a plurality of versions of a simulation may be run using log data collected by a vehicle operating in an autonomous driving mode. The plurality of versions may be run using the software to control a simulated vehicle, and each of the plurality of versions may have a set of timing requirements different from the set of timing requirements of other of the plurality of versions. Results of the plurality of versions may be compared to the log data. A realism metric defining timing requirements for one or more future simulations may be generated based on the comparison.

20 Claims, 13 Drawing Sheets

(56) References Cited

OTHER PUBLICATIONS

Saeed Asadi Bagloee et al.; Autonomous vehicles: challenges, opportunities, and future implications for transportation policies; J. Mod. Transport. (2016) 24(4):284-303 (Year: 2016).*

Ding Zhao; "Accelerated Evaluation of Automated Vehicles"; A dissertation submitted in partial fulfillment of the requirements for the degree of Doctor of Philosophy (Year: 2016).*

* cited by examiner

REALISM METRIC FOR TESTING SOFTWARE FOR CONTROLLING AUTONOMOUS VEHICLES

CROSS REFERENCE TO RELATED APPLICATIONS

The present application is a continuation of U.S. patent application Ser. No. 16/108,702, filed Aug. 22, 2018, the entire disclosure of which is incorporated herein by reference.

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. It is critical that the autonomous control software used by these vehicles to operate in the autonomous mode is tested and validated before such software is actually used to control the vehicles in areas where the vehicles are interacting with other objects.

BRIEF SUMMARY

One aspect of the disclosure provides a method of determining a realism metric for testing software for operating a vehicle in an autonomous driving mode. The method includes running, by one or more processors, a plurality of versions of a simulation using log data collected by a vehicle operating in an autonomous driving mode, wherein the plurality of versions are run using the software to control a simulated vehicle, each of the plurality of versions has a set of timing requirements different from the set of timing requirements of other of the plurality of versions; comparing, by the one or more processors, results of the plurality of versions to the log data; and generating, by the one or more processors, a realism metric defining timing requirements for one or more future simulations based on the comparison.

In one example, the method also includes using the realism metric to run a second simulation different from the simulation. In another example, the set of timing requirements includes a start time corresponding to a time in the log data at which a version of a simulation is started. In another example, the method also includes determining, for one version of the plurality of versions, a start time corresponding to a time in the log data at which the one version is started by adjusting an initial start time for the simulation to an earlier point in time in the log data, and wherein the start time is one of the set of timing requirements for the one version. In another example, the set of timing requirements includes an engage time corresponding to a time in the log data at which the software is given control of the simulated vehicle. In this example, the set of timing requirements further includes a start time corresponding to a time in the log data at which a simulation is started, and the engage time is measured from the start time. In another example, the method also includes determining, for one version of the plurality of versions, an engage time corresponding to a time in the log data at which the software is given control of the simulated vehicle by adjusting an initial start time for the simulation to an earlier point in time in the log data, and wherein the engage time is one of the set of timing requirements for the one version. In another example, the set of timing requirements includes timing requirements for sending of messages by different modules of the software. In this example, the modules include a perception system, a planning system, and a control system. In another example, the set of timing requirements includes timing requirements for simulated actuators of the simulated vehicle.

In this example, the simulated actuators include controls for controlling the acceleration, deceleration, or steering control of the simulated vehicle. In another example, the method also includes determining the sets of timing requirements using a uniform search over different possible values. In another example, at least one value of the set of timing requirements is consistent over two or more of the plurality of versions. In another example, the comparing includes comparing locations of the simulated vehicle with locations of the vehicle in the log data. In another example, the comparing includes comparing speed of the simulated vehicle with speed of the vehicle in the log data. In another example, the comparing includes comparing orientation of the simulated vehicle with orientation of the vehicle in the log data. In another example, determining the realism metric includes determining whether the comparison for a given version of the plurality of versions indicates that for some threshold percentage of time, the simulated vehicle was within a predetermined distance of a location of the vehicle from the log data. In another example, the method also includes determining whether the comparison for each version of the plurality of versions indicates that a similarity threshold has been met and aggregating the sets of timing requirements for the versions where the comparison is determined to indicate that the similarity threshold has been met, wherein generating the realism metric is further based on the aggregated sets of timing requirements. In this example, aggregating includes averaging the sets of timing requirements. In another example, the method also includes determining whether the comparison for each version of the plurality of versions indicates that a similarity threshold has been met, and when the comparison is determined to indicate that a similarity threshold has not been met, flagging the simulation for review.

DETAILED DESCRIPTION

Overview

Figure 1:
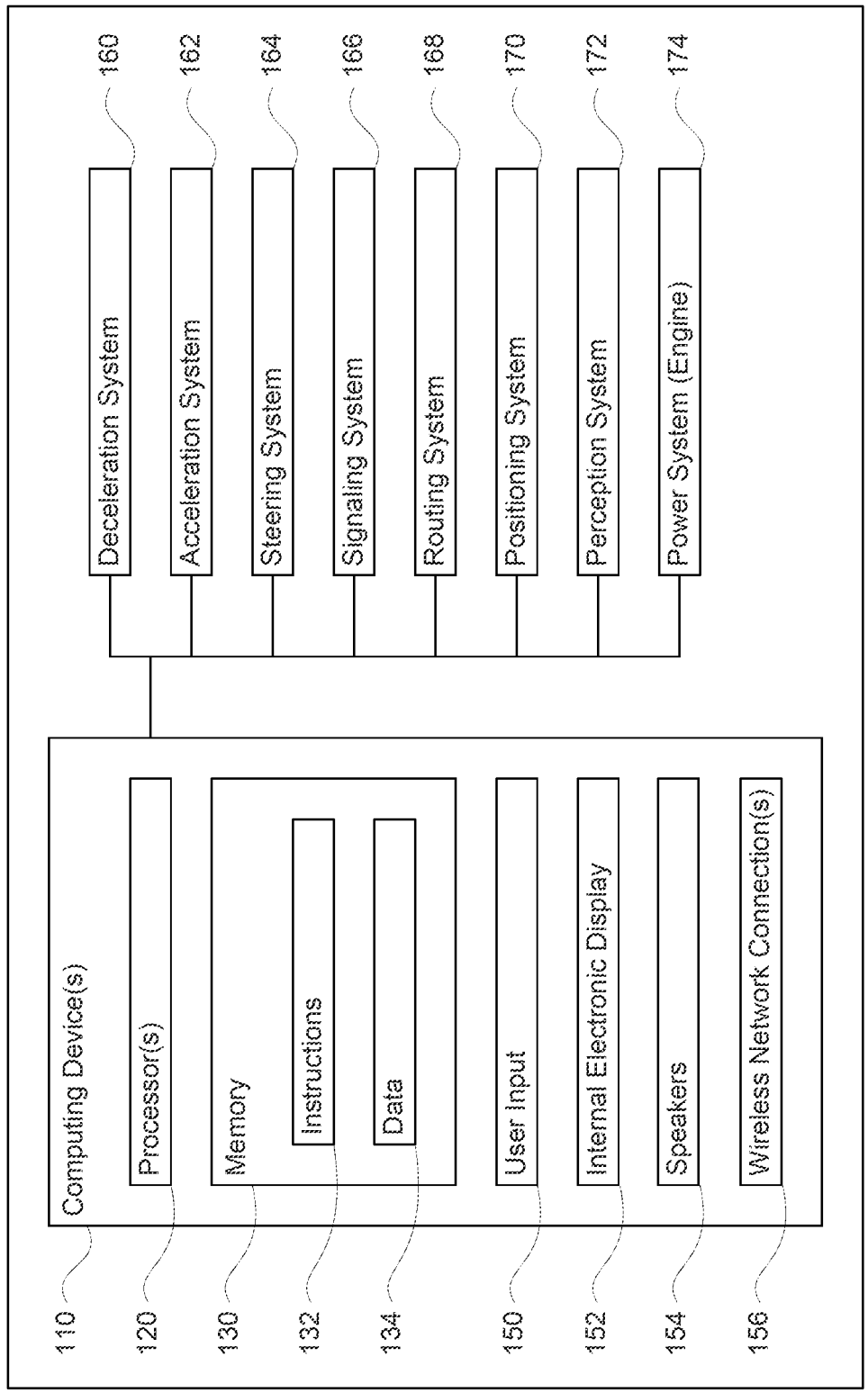
FIG. 1 is a functional diagram of an example vehicle in accordance with an exemplary embodiment.

The technology relates to evaluating collisions in log-based simulations using software for vehicles operating autonomously. The log-based simulations correspond to simulations which are run using log data collected by a vehicle operating in an autonomous mode over some period of time, such as 1 minute or more or less. The log data may include information from the vehicle's various systems including perception, routing, planning, positioning, etc. At the same time, the actual vehicle is replaced with a simulated vehicle which can make decisions using software for controlling the vehicle autonomously. By doing so, the software can be rigorously tested.

However, when running a simulation using logged data, it can be difficult to make the simulation perfectly match actual driving behavior. For instance, if a pedestrian is observed on a sidewalk adjacent to a crosswalk for 2 seconds, a reasonable impression would be that the pedestrian is very likely to enter the crosswalk. If that same pedestrian is observed on a sidewalk adjacent to a crosswalk for 30 seconds, it may be more likely that the pedestrian is not going to enter the crosswalk. In order to realistically simulate a situation in which the vehicle waited on a pedestrian for 30 seconds and then proceeded because the pedestrian is not crossing, it is critical important to start simulation with enough time for the 30 second wait. Otherwise, there would be significant divergence between the behavior of the simulated vehicle and the vehicle in the log data which may lead to unintended results.

Thus, when the simulation begins (at what point in the log data) and when the software is engaged (i.e. the software takes control of the vehicle in the simulation) are situationally dependent and also critical to ensuring realism in log-based simulations. To address this, for each given simulation and corresponding log data, a realism metric, that represents the "best" timing for the given simulation.

The realism metric may be generated by running a plurality of slightly different versions of a simulation wherein timing requirements of the simulation are slightly adjusted. For instance, one timing requirement may include a start time that may be slightly adjusted over a plurality of different versions of the same simulation. Another timing requirement may be an "engage" time, or when the software is given control of the simulated vehicle in a simulation, and as with the start time, may be slightly adjusted over a plurality of different versions of the same simulation.

In some situations, a simulation may actually under represent the amount of time it takes to respond to a stimulus. In other words, the simulated vehicle in a simulation may actually end up reacting to a situation faster, and perhaps better, than a real vehicle. In that regard, the realism metric may include additional timing features to account for such differences. For instance, other timing requirements may include the timing of messages sent by different software modules as well as the simulated actuators of the simulated vehicle. As with the start times and engage times, this timing may also be adjusted. In other words, intentional delays may be introduced into the delivery of messages as well as the physical changes in the speed and orientation of the vehicle.

The results of the different versions of the simulations may then be compared to the log data for that simulation in order to determine a realism metric. For instance, the timing requirements of the version that is closest to the log data may be used as the realism metric. As another instance, the values of the versions that meet a threshold with respect to the log data may then be aggregated, for instance averaged, in order to determine the realism metric for that simulation or log data. If none of the versions meet the threshold, then there may be some issue with the simulation. In this regard, the simulation and/or any of the versions may be flagged for review by an operator. Examination of such scenarios and/or versions may lead to reasons why the threshold was not met and identify bugs in the software.

The features described above provide for a safe, effective, and realistic way of testing software for autonomous vehicles. For instance, the software can be tested in hundreds of thousands of scenarios numerous times without endangering the life and property of actual persons and at relatively little cost as compared to actual driving. Moreover, by using a realism metric as described here, the realism of the simulation is even greater and independent of the functionality of the server farm running the simulation. Without such testing, the risks of injury to persons or property using untested software may be too great.

Example Systems

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 134 and data 132 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 134 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 132 may be retrieved, stored or modified by processor 120 in accordance with the instructions 134. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be control computing devices of an autonomous driving computing system or incorporated into vehicle 100. The autonomous driving computing system may capable of communicating with various components of the vehicle in order to control the movement of vehicle 100 according to the autonomous control software of memory 130 as discussed further below. For example, returning to FIG. 1, computing devices 110 may be in communication with various systems of vehicle 100, such as deceleration system 160, acceleration system 162, steering system 164, signaling system 166, routing system 168, positioning system 170, perception system 172, and power system 174 (i.e. the vehicle's engine or motor) in order to control the movement, speed, etc. of vehicle 100 in accordance with the instructions 134 of memory 130. Again, although these systems are shown as external to computing devices 110, in actuality, these systems may also be incorporated into computing devices 110, again as an autonomous driving computing system for controlling vehicle 100.

As an example, computing devices 110 may interact with one or more actuators of the deceleration system 160 and/or acceleration system 162, such as brakes, accelerator pedal, and/or the engine or motor of the vehicle, in order to control the speed of the vehicle. Similarly, one or more actuators of the steering system 164, such as a steering wheel, steering shaft, and/or pinion and rack in a rack and pinion system, may be used by computing devices 110 in order to control the direction of vehicle 100. For example, if vehicle 100 is configured for use on a road, such as a car or truck, the steering system may include one or more actuators to control the angle of wheels to turn the vehicle. Signaling system 166 may be used by computing devices 110 in order to signal the vehicle's intent to other drivers or vehicles, for example, by lighting turn signals or brake lights when needed.

Routing system 168 may be used by computing devices 110 in order to determine and follow a route to a location. In this regard, the routing system 168 and/or data 132 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Figure 2:
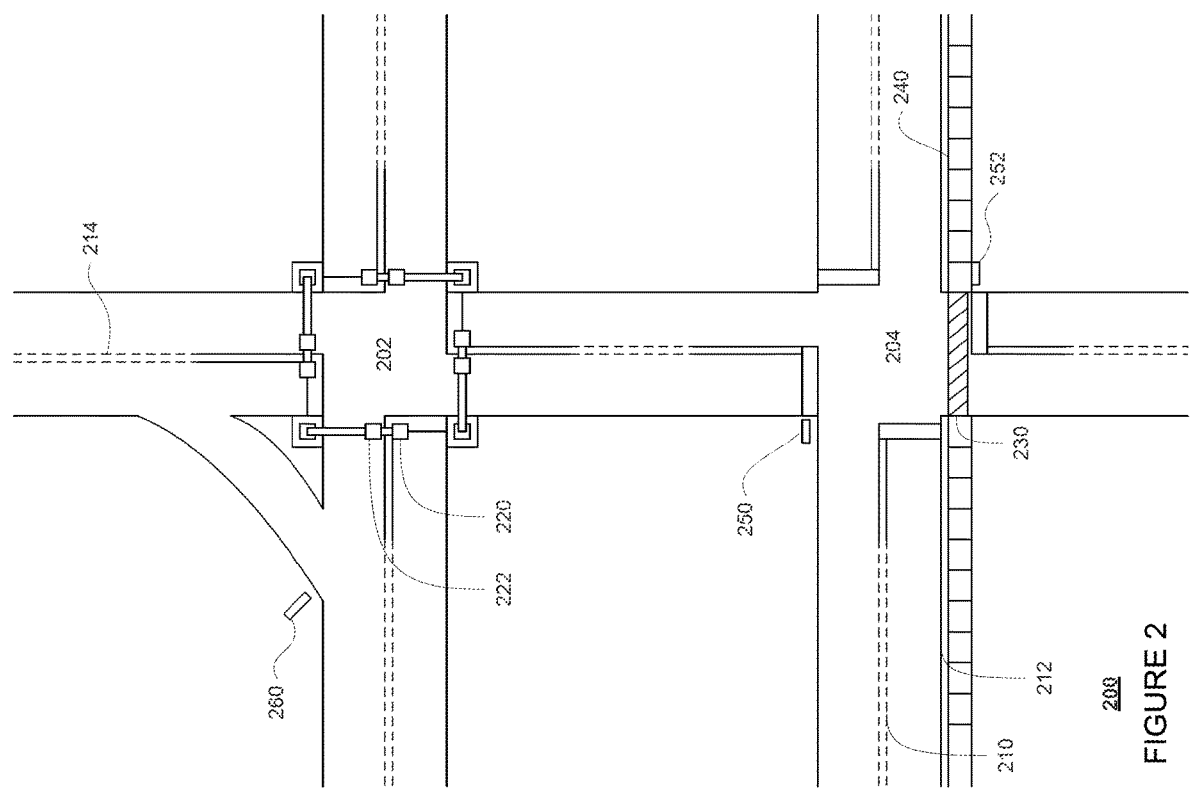
FIG. 2 is an example of map information in accordance with aspects of the disclosure.

FIG. 2 is an example of map information 200 for a section of roadway including intersections 202 and 204. In this example, the map information 200 includes information identifying the shape, location, and other characteristics of lane lines 210, 212, 214, traffic signal lights 220, 222, crosswalk 230, sidewalks 240, stop signs 250, 252, and yield sign 260. Although the map information is depicted herein as an image-based map, the map information need not be entirely image based (for example, raster). For example, the map information may include one or more roadgraphs or graph networks of information such as roads, lanes, intersections, and the connections between these features. Each feature may be stored as graph data and may be associated with information such as a geographic location and whether or not it is linked to other related features, for example, a stop sign may be linked to a road and an intersection, etc. In some examples, the associated data may include grid-based indices of a roadgraph to allow for efficient lookup of certain roadgraph features.

Positioning system 170 may be used by computing devices 110 in order to determine the vehicle's relative or absolute position on a map or on the earth. For example, the position system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 110, other computing devices and combinations of the foregoing.

Figure 3:
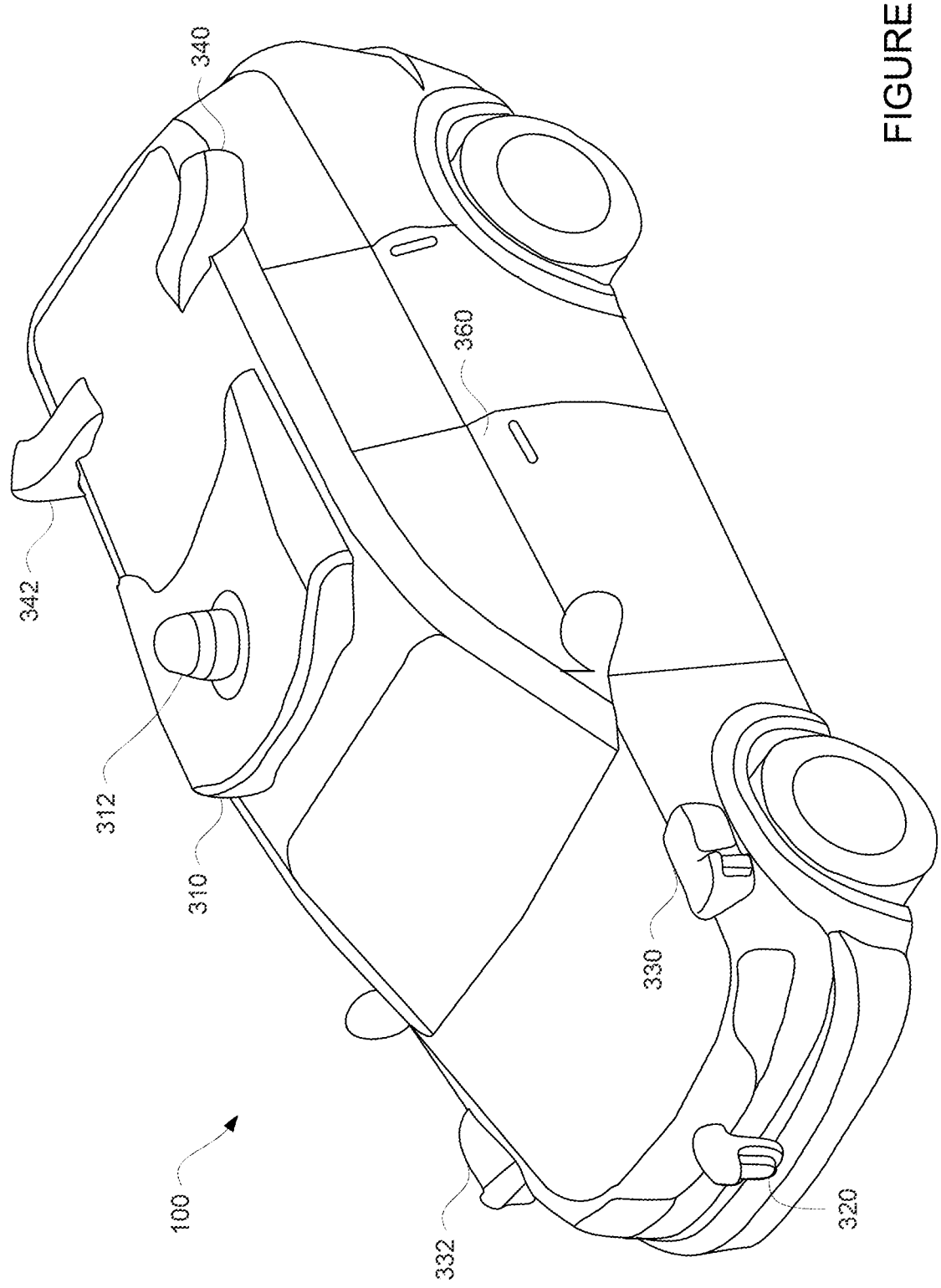
FIG. 3 is an example external view of a vehicle in accordance with aspects of the disclosure.

The perception system 172 also includes one or more components for detecting objects external to the vehicle such as other vehicles, obstacles in the roadway, traffic signals, signs, trees, etc. For example, the perception system 172 may include lasers, sonar, radar, cameras and/or any other detection devices that record data which may be processed by computing device 110. In the case where the vehicle is a passenger vehicle such as a minivan, the minivan may include a laser or other sensors mounted on the roof or other convenient location. For instance, FIG. 3 is an example external view of vehicle 100. In this example, roof-top housing 310 and dome housing 312 may include a LIDAR sensor as well as various cameras and radar units. In addition, housing 320 located at the front end of vehicle 100 and housings 330, 332 on the driver's and passenger's sides of the vehicle may each store a LIDAR sensor. For example, housing 330 is located in front of driver door 360. Vehicle 100 also includes housings 340, 342 for radar units and/or cameras also located on the roof of vehicle 100. Additional radar units and cameras (not shown) may be located at the front and rear ends of vehicle 100 and/or on other positions along the roof or roof-top housing 310.

The computing devices 110 may control the direction and speed of the vehicle by controlling various components. By way of example, computing devices 110 may navigate the vehicle to a destination location completely autonomously using data from the detailed map information and routing system 168. Computing devices 110 may use the positioning system 170 to determine the vehicle's location and perception system 172 to detect and respond to objects when needed to reach the location safely. In order to do so, computing devices 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
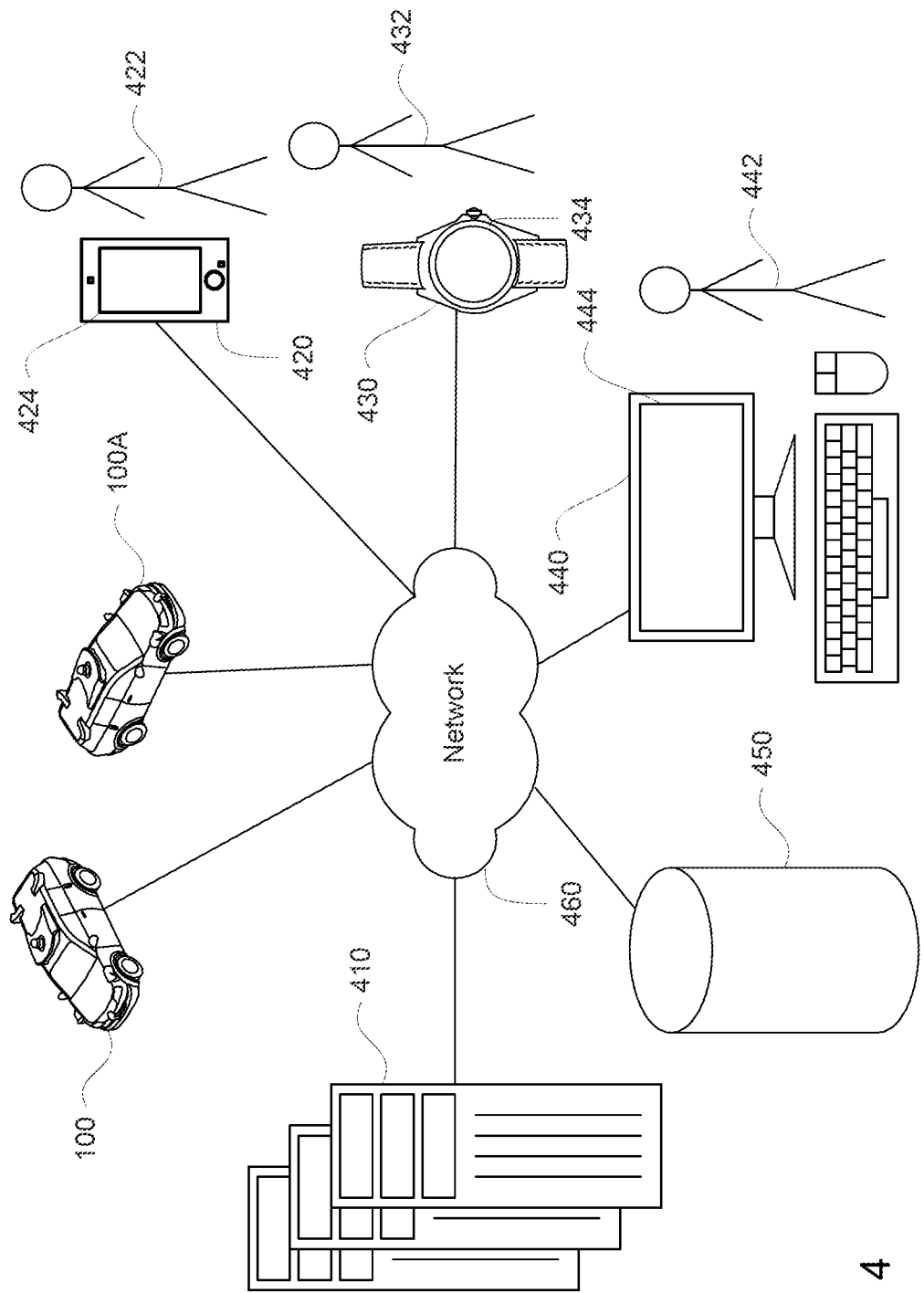
FIG. 4 is a pictorial diagram of an example system in accordance with aspects of the disclosure.
Figure 5:
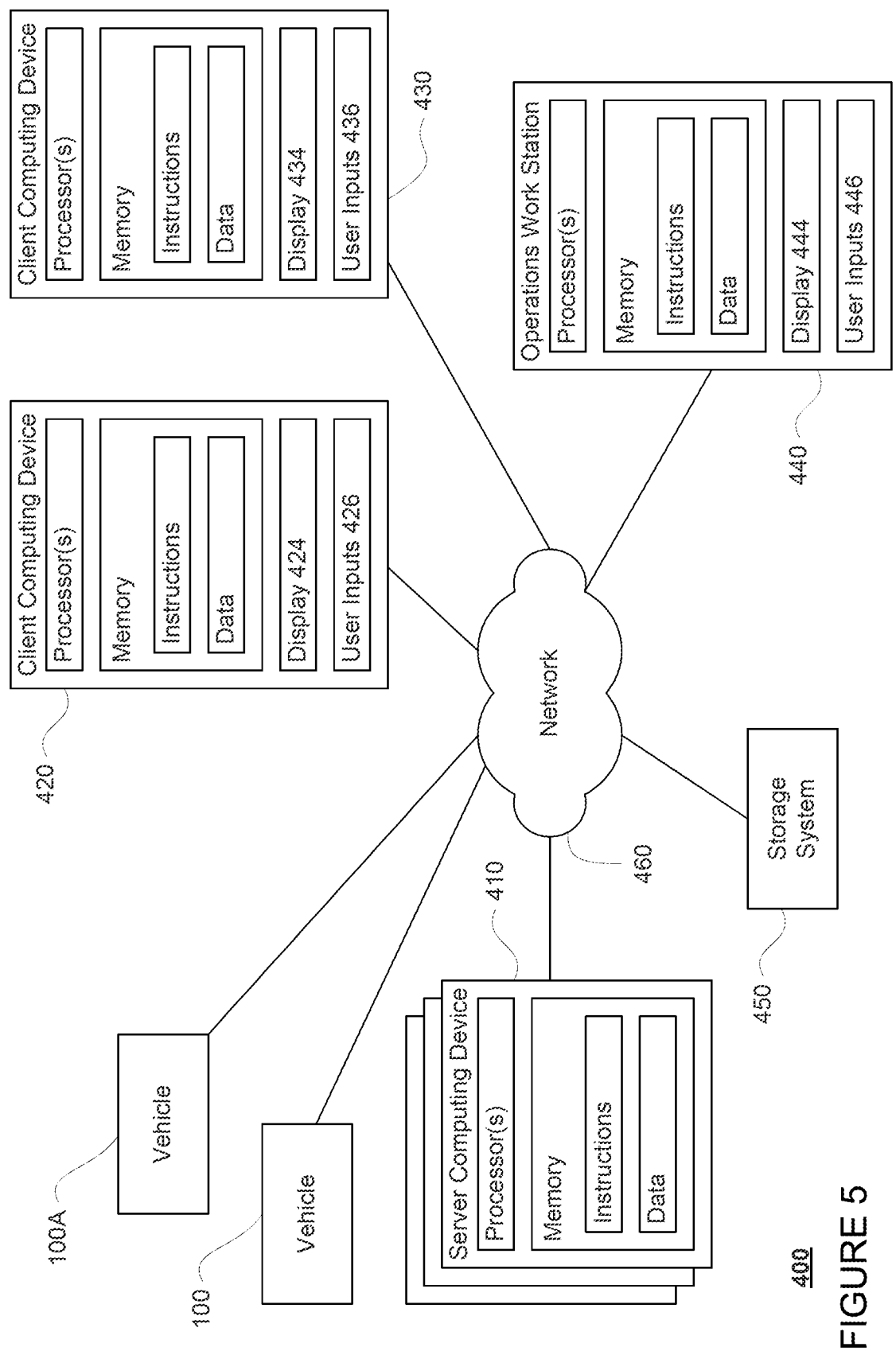
FIG. 5 is a functional diagram of the system of FIG. 4 in accordance with aspects of the disclosure.

Computing device 110 of vehicle 100 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 100, and vehicles 100A, 100B which may be configured the same as or similarly to vehicle 100. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 120, memory 130, data 132, and instructions 134 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a validation computing system which can be used to validate autonomous control software which vehicles such as vehicle 100 and vehicle 100A may use to operate in an autonomous driving mode. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 4, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example the user may input information using a small keyboard, a keypad, microphone, using visual signals with a camera, or a touch screen.

In some examples, client computing device 440 may be an operations workstation used by an administrator or operator to review scenario outcomes, handover times, and validation information as discussed further below. Although only a single operations workstation 440 is shown in FIGS. 4 and 5, any number of such work stations may be included in a typical system. Moreover, although operations work station is depicted as a desktop computer, operations works stations may include various types of personal computing devices such as laptops, netbooks, tablet computers, etc.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store log data. This log data may include, for instance, sensor data generated by a perception system, such as perception system 172 of vehicle 100. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The log data may also include "event" data identifying different types of events such as collisions or near collisions with other objects, planned trajectories describing a planned geometry and/or speed for a potential path of the vehicle 100, actual locations of the vehicles at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation.

In addition, the storage system 450 may also store autonomous control software which is to be used by vehicles, such as vehicle 100, to operate a vehicle in an autonomous driving mode. This autonomous control software stored in the storage system 450 may be a version which has not yet been validated. Once validated, the autonomous control software may be sent, for instance, to memory 130 of vehicle 100 in order to be used by computing devices 110 to control vehicle 100 in an autonomous driving mode.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

In order to test and/or validate the autonomous control software which will be stored in memory 130 for use by the computing devices 110 of vehicle 100, the server computing devices 410 may run various simulations. These simulations may be log based simulations that are generated from the information stored in the aforementioned log data of storage system 450. In this regard, the server computing devices 410 may access the storage system 450 in order to retrieve the log data and run a simulation. For instance, a portion of the log data corresponding to a minute in real time of an autonomous vehicle that generated the log data may be retrieved from the storage system. This portion of log data may be "hand" selected by human operators and/or computing devices based on the types of events recorded in the logs or more randomly, for instance, by selecting 1% or more or less of all autonomous driving logs.

The retrieved portion of log data may be used to run a simulation. When running the autonomous control software through the portion of log data, the details (sensor data and events) of the log data may be used to generate a simulation. In other words, the sensor data of the portion of log data may simply be "played" as input to the perception system 172 of a simulated vehicle controlled by the autonomous control software. In this regard, the autonomous control software "experiences" or processes the log data as if the autonomous control software was actually being run on vehicle 100. In other words, the simulation may include data defining characteristics of objects such as shape, location, orientation, speed, etc. of objects such as vehicles, pedestrians, bicyclists, vegetation, curbs, lane lines, sidewalks, crosswalks, buildings, etc. defined by the sensor data of the log data. Further, the simulation may include characteristics for a simulated vehicle, corresponding to vehicle 100, including the simulated vehicle's shape, location, orientation, speed, etc. defined by the events of the log data. In addition, the software may include various modules corresponding to the system of vehicle 100, such as a perception system, a planning system, and control systems (such as a steering system, acceleration system, deceleration system, power system, etc.).

Figure 6:
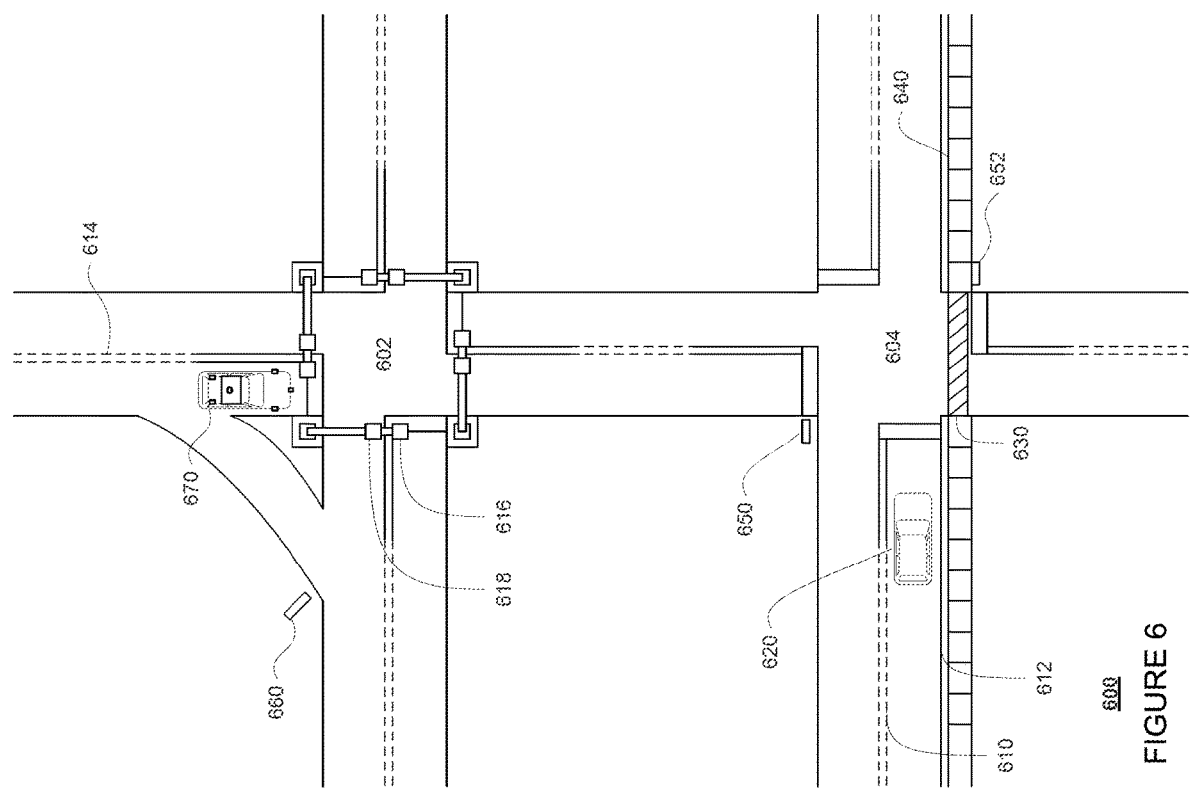
FIG. 6 is an example representation of a simulation in accordance with aspects of the disclosure.

FIG. 6 provides an example 600 of a simulation for a section of roadway corresponding to the map information 200. In this example, intersections 602 and 604 correspond to intersections 202 and 204, respectively. This regard, the shape, location, and other characteristics of lane lines 610, 612, 614, traffic signal lights 616, 618, crosswalk 630, sidewalks 640, stop signs 650, 652, and yield sign 660 corresponds to the shape, location and other characteristics of lane lines 210, 212, 214, traffic signal lights 220, 222, crosswalk 230, sidewalks 240, stop signs 250, 252, and yield sign 260. In example 600, a simulated vehicle 670, corresponding to vehicle 100 or vehicle 100A, is approaching an intersection 604. An agent vehicle 620, generated from sensor data and/or event data from the log data for the simulation, is also approaching intersection 604.

In some instances, the autonomous control software is only provided with information which the perception system 172 would be able to detect about the scenario, and not every detail of the scenario. For instance, returning to example 600, the server computing devices 410 may run the scenario such that the autonomous control software is given access to the detailed map information 200 as well as any information that would be detected by a perception system of the simulated vehicle 670.

As noted above, when running a simulation using logged data, it can be difficult to make the simulation perfectly match actual driving behavior. Thus, when the simulation begins (at what point in the log data) and when the software is engaged (i.e. the software takes control of the vehicle in the simulation) are situationally dependent and also critical to ensuring realism in log-based simulations. To address this, for each given simulation and corresponding log data, a realism metric, that represents the "best" timing for the given simulation.

As indicated above, a realism metric may be generated by running a plurality of versions of a simulation, each being slightly different because timing requirements of the simulation are slightly adjusted. For instance, one timing requirement may include a start time that may be slightly adjusted over a plurality of different versions of the same simulation. For example, a first of the versions may use an initial start time (i.e. a default or hand selected start time) that represents a point in time in the log data that the simulation will start. In this regard, FIG. 6 may represent a simulation at an initial start time.

To generate start times for additional versions, this initial start time may be adjusted by moving the start time earlier point in time in the log data a fixed amount of time, such as 1 second or more or less, a fixed number of times, such as 10 or more or less. In other words, assuming that the "end of the simulation" in the log data remains fixed, each version of the simulation may be slightly longer than the first of the versions as additional seconds are added. As examples, FIG. 7 may represent an initial start time that is 1 second earlier than the example of FIG. 6, and FIG. 8 may represent an initial start time that is 1 second earlier than the example of FIG. 7.

Another timing requirement may be an "engage" time, or when the software is given control of the simulated vehicle in a simulation, and as with the start time, may be slightly adjusted over a plurality of different versions of the same simulation. The engage time for a given version may be measured off of the start time for that version. In this regard, to generate engage times for different versions, different amounts of time may be added to the start times for those versions. As an example, these engage times may range from 0.5 seconds to 4.5 seconds or more or less at discrete intervals, such as 1 second or more or less, from the start time. Thus, if there are 10 different start times and 5 different engage times, there may be 50 different sets of timing requirements and thus, 50 different versions of a simulation.

Figure 7:
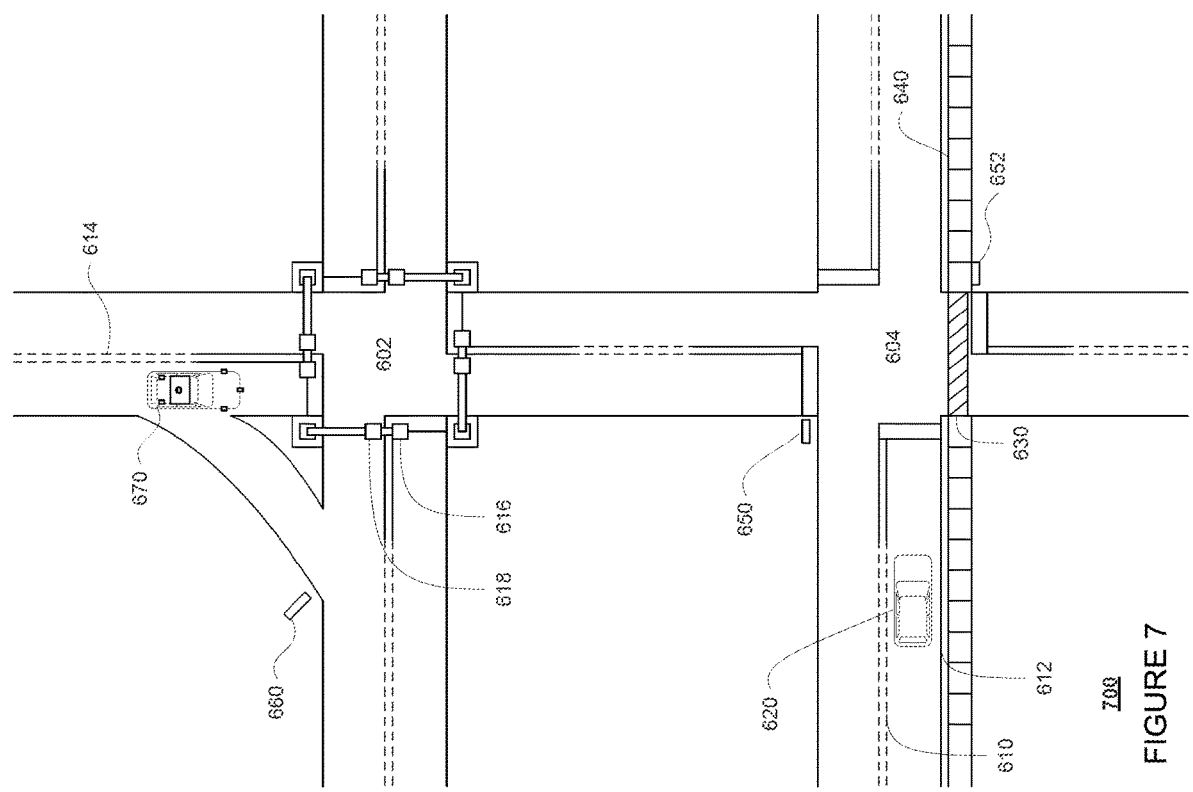
FIG. 7 is a further example representation of a simulation in accordance with aspects of the disclosure.
Figure 8:
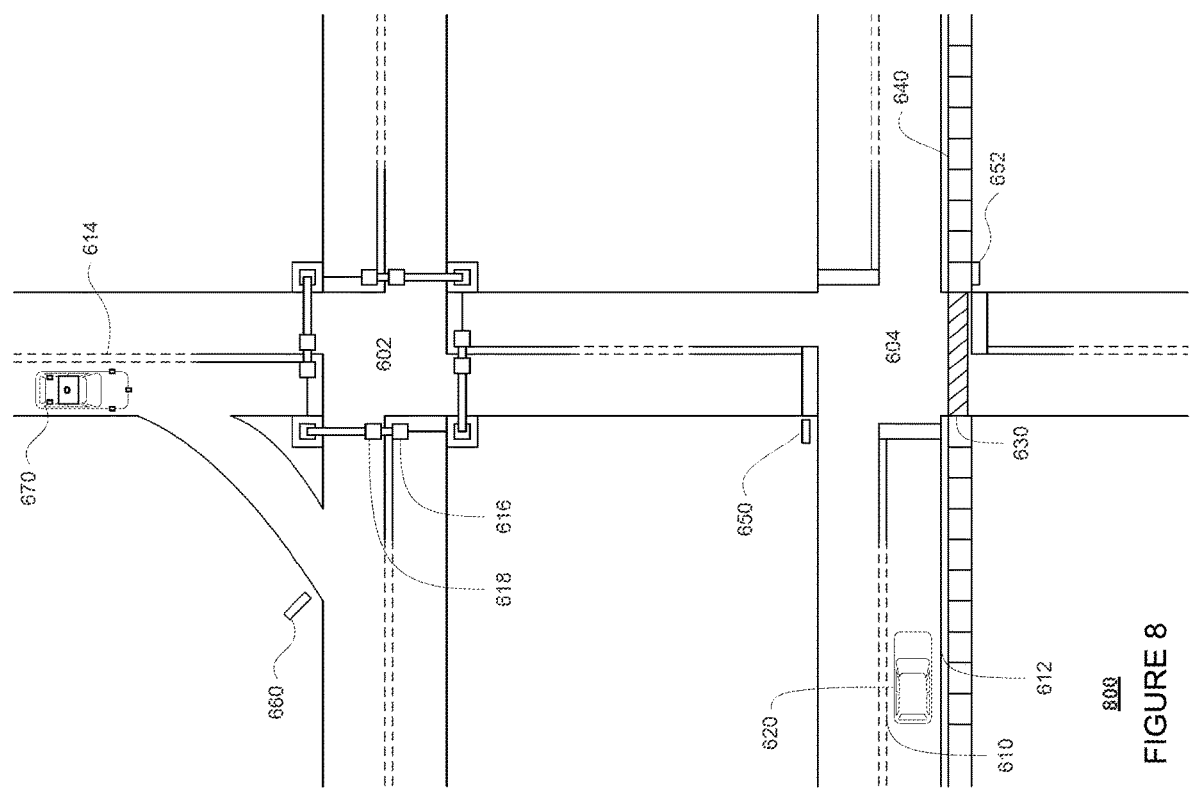
FIG. 8 is another example representation of a simulation in accordance with aspects of the disclosure.
Figure 9:
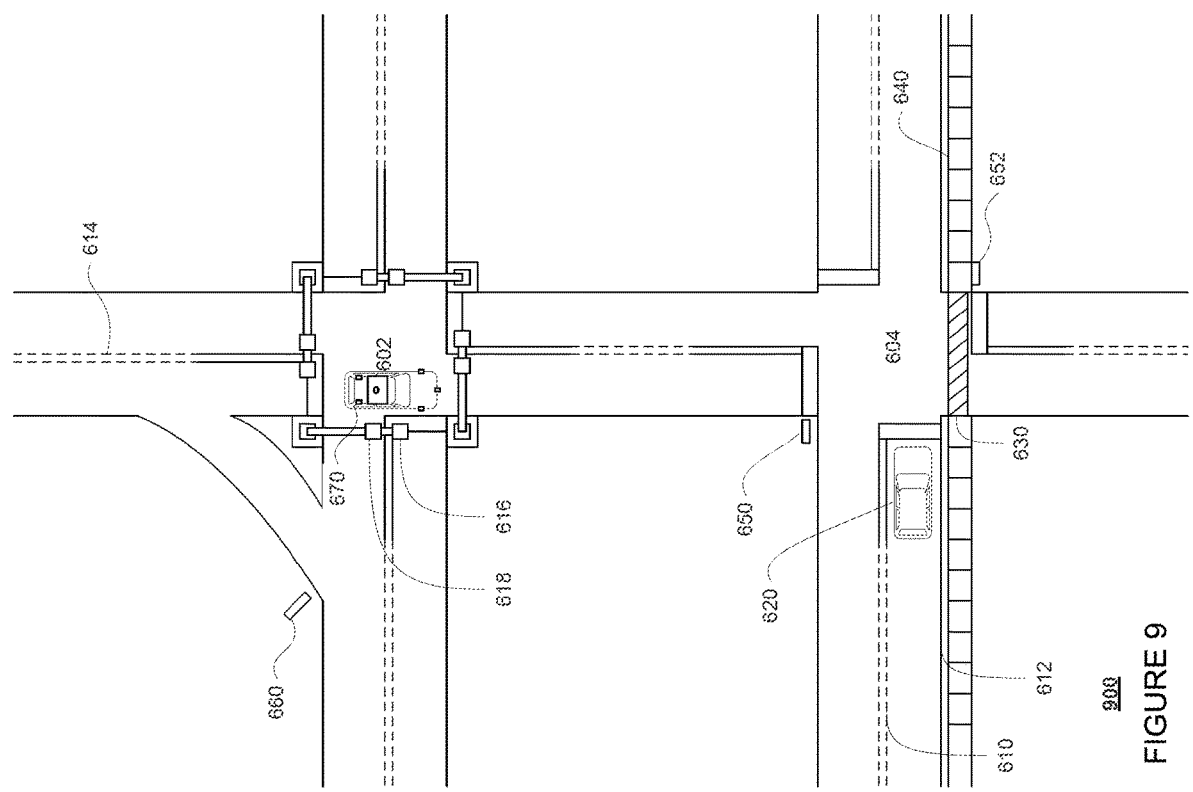
FIG. 9 is an example representation of an engage time of the simulation of FIG. 6 in accordance with aspects of the disclosure.
Figure 10:
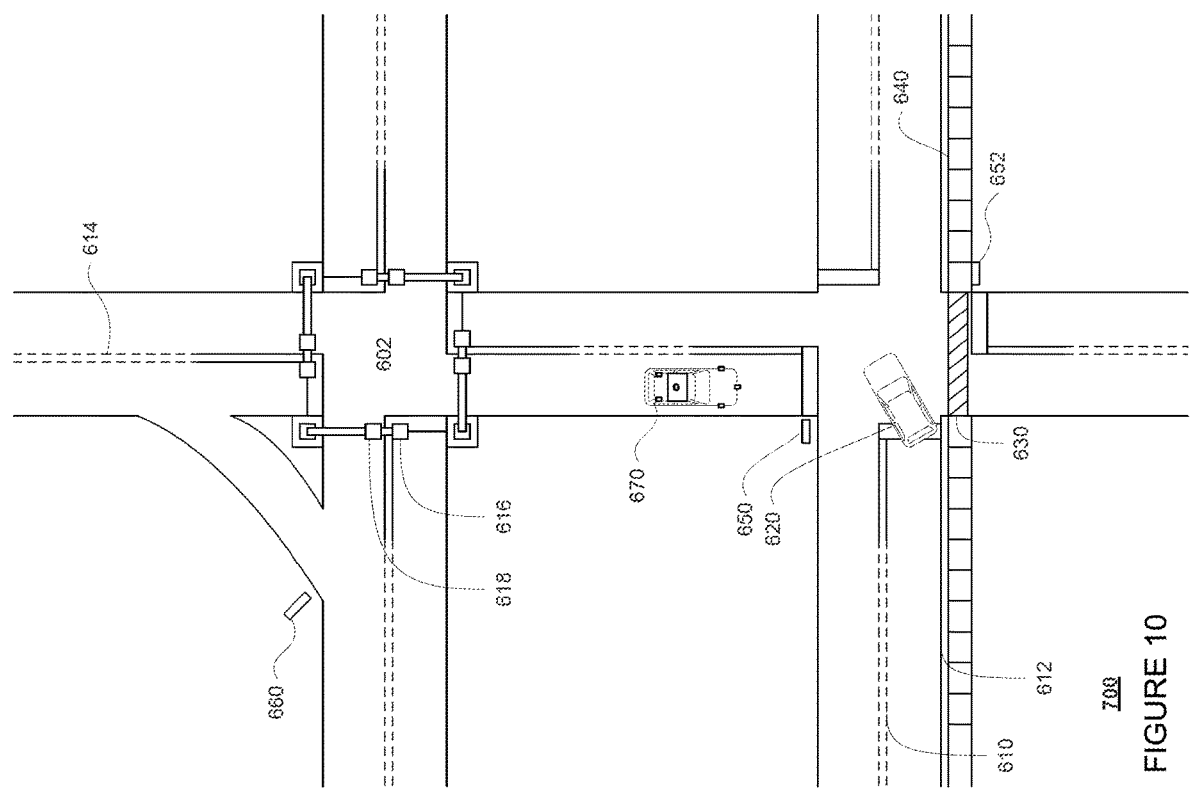
FIG. 10 is an example representation of an engage time of the simulation of FIG. 7 in accordance with aspects of the disclosure.
Figure 11:
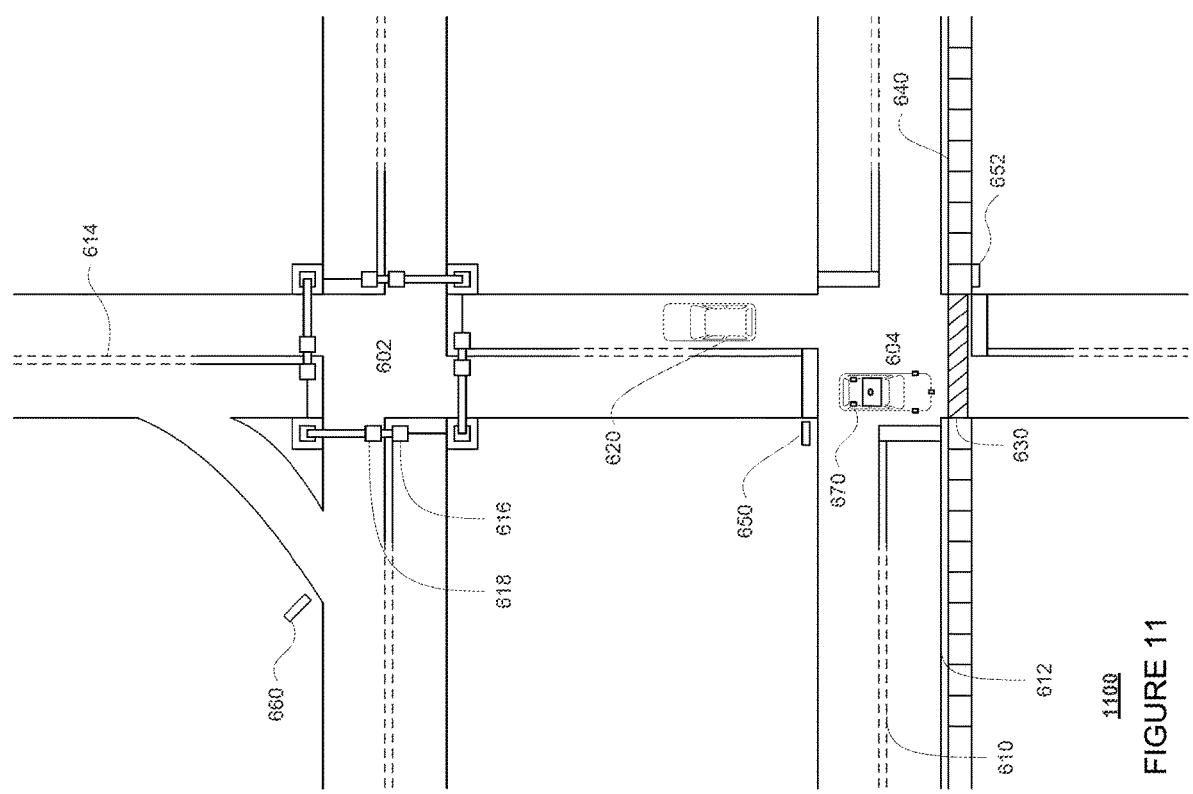
FIG. 11 is an example representation of an engage time of the simulation of FIG. 8 in accordance with aspects of the disclosure.

For instance, example 900 of FIG. 9 represents an engage time for the example 600 of FIG. 6, example 1000 of FIG. 10 represents an engage time for the example 700 of FIG. 7, and example 1100 of FIG. 11 represents an example engage time for the example 800 of FIG. 8. In these examples, each of these figures, FIGS. 9-11 thus represent a time difference of 1 second from the examples of FIGS. 6-8, respectively. As can be seen, this puts the simulated vehicle 670 at different locations at the start time as well as at the engage time for different versions of the simulation. At the same time, the agent vehicle 620 is also at different locations at the start time as well as the engage time for different versions of the simulation. As such, the plurality of versions for this simulation may provide vastly different results.

The results of each version of a simulation may correspond to the event data of log data, and may therefore include information such as collisions or near collisions with other objects, planned trajectories describing a planned geometry and/or speed for a potential path of the simulated vehicle, locations of the simulated vehicle at different times, orientations/headings of the simulated vehicle at different times, speeds, accelerations and decelerations of the simulated vehicle at different times in the simulation, classifications of and responses to perceived objects, behavior predictions of perceived objects, status of various simulated systems (such as acceleration, deceleration, perception, steering, signaling, routing, power, etc.) of the simulated vehicle at different times including logged errors, inputs to and outputs of the various systems of the simulated vehicle at different times in the simulation, etc.

Each simulation may have a simulated clock that maps the simulation to real time, as everything in the simulation may likely occur at a different pace than real time. This may allow the simulation to have better "control" over the timing. For instance, servers in a server farm computing simulations may function faster, or in some cases where there is a heavy load on the system much slower, than a vehicle in the real world. So, each of these adjustments in time may be in the simulation time, as opposed to real world time.

At the same time, by simply not advancing time during period of long computation, the simulation may actually under represent the amount of time it takes to respond to a stimulus. In other words, the simulated vehicle in a simulation may actually end up reacting to a situation faster, and perhaps better, than a real vehicle. In that regard, the realism metric may include additional timing features to account for such differences.

This aspect of the realism metric may be determined in a plurality of different ways some of which may have readily apparent drawbacks. For instance, this is because delays in processing and actions by a vehicle are generally situationally dependent. As an example, more difficult or complex situations may also require greater amounts of time to process and respond. This may not necessarily be because of the server processing power and speed, but because the software will have more calculations to make if it has to identify and respond to more objects, etc. However, using the delays provided in the log data is not always perfect because timing in real life is not always stable. At the same time, use an average or some percentage value for the delay or some specific delay, such as the 90th or 95th percentile of delays from the log data may end up being inaccurate in some situations.

To address this, the timing requirements of the plurality of versions may include the timing of messages sent by different modules of the software. These modules may include software for the vehicle's perception system, planner system, and control systems (such as a steering system, acceleration system, deceleration system, power system, etc.) as well as the simulated actuators (brakes, accelerator, steering, etc.) of the control systems of the simulated vehicle. As with the start times and engage times, this timing may be adjusted across the plurality of versions of a simulation. In other words, intentional delays may be introduced into the delivery of messages as well as the physical changes in the speed and orientation of the vehicle. As one example, the different versions of a simulation may vary one or more of these values + or −10 percent which thus may be on the order of a millisecond or more or less. These values may be determined using a uniform search over different possible values starting with the values defined in the log data.

Figure 12:
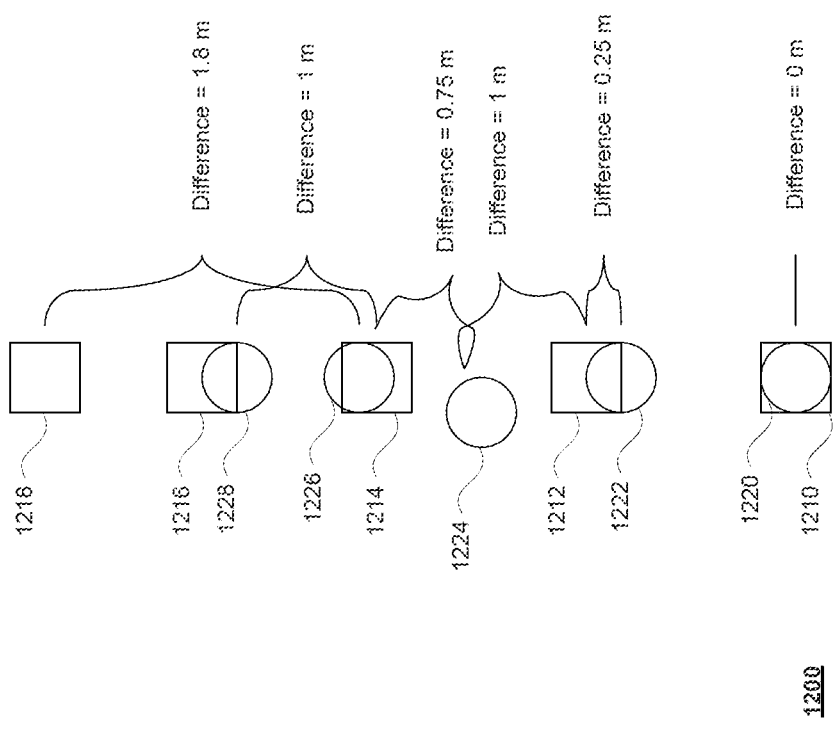
FIG. 12 is an example comparison of results of a version of a simulation with log data in accordance with aspects of the disclosure.

The results of the plurality of versions of the simulations may then be compared to the log data for the simulation. For instance, this may involve comparing different locations of the vehicle from the log data with the different locations of the simulated vehicles at different times during the simulation. Turning to example, 1200 of FIG. 12, locations for an actual vehicle from the log data are represented by squares and increasing in time from 1210 to 1218. Similarly, locations for a simulated vehicle are represented by circles and increasing in time from 1220 to 1228. Each of these locations may represent a point in time either in the simulation or the log data. Of course, the simulation may have the aforementioned simulated clock that corresponds to the clock in the log data in order to allow for the identification of corresponding points in the log data and the simulation. As such, for comparison purposes, location 1210 and location 1220 correspond to a first point in time, location 1212 and 1222 correspond to a second point in time, and so on. In this example, the locations may be compared to determine the differences (or distances) between the locations. The smaller these distances are over the course of a version of a simulation or the smaller the average of these distances is, the closer the version is to the log data. Other features, such as speed, orientation, heading, etc. may also be compared in similar ways.

In one example, the timing requirements of the "closest" version or the version with least amount of difference (or the minimum amount of divergence) from the log data, may be used as the realism metric. As an example, the closest version may be the version with the absolute smallest differences, with the smallest average differences, or that is at the 95th percentile or more or less of smallest differences between one or more of location, speed, orientation, heading, etc. In this regard, when one or more future versions of the simulation are run in order to test the same or different versions of the software, the timing requirements of this closest version, including start time, engage time, and timing of messages, may be used to control such future versions.

In some instances, if the differences between the results and the log data are within some similarity threshold for one or more versions, those versions of the simulation may be used to determine the realism metric. As an example, if for a given version of the simulation, some percentage of the time, such as 99% or more or less, the vehicle stays within some predetermined distance, such as 1 meter or more or less as the position of the vehicle within the log data, the timing requirement of the given version of the simulation may be used to determine realism metric. The values of the versions that meet this threshold may then be aggregated, for instance averaged, in order to determine the realism metric for that simulation or log data.

If none of the versions meet the threshold, then there may be some issue with the simulation. In this regard, the simulation and/or any of the versions may be flagged for review by an operator. Examination of such scenarios and/or versions may lead to reasons why the threshold was not met and identify bugs in the software.

In some instances, the software used to determine the delays may be the same software version that was used to generate the log data for a given scenario. This may avoid unrealistic results of comparing the log data to the behavior of different software versions where divergence may vary for any number of different reasons.

Figure 13:
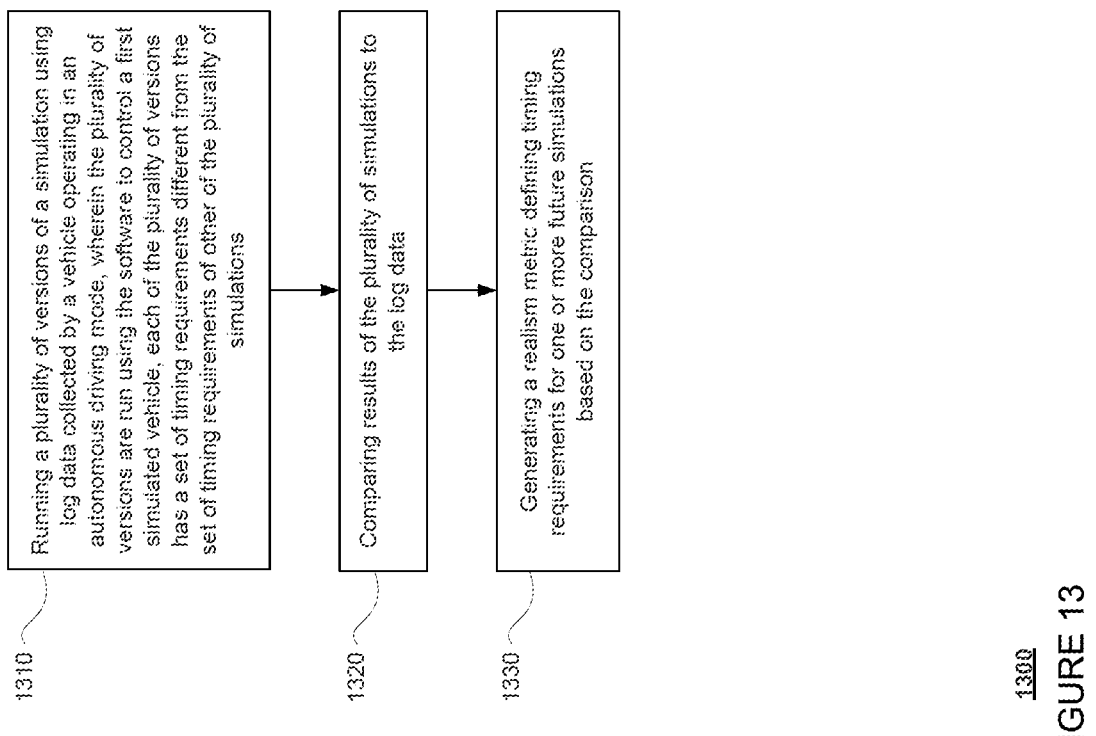
FIG. 13 is an example flow diagram in accordance with aspects of the disclosure.

FIG. 13 includes an example flow diagram 1300 of some of the examples for testing software for controlling a vehicle in an autonomous driving mode, which may be performed by one or more processors such as processors of computing devices 410. For instance, at block 1310, a plurality of versions of a simulation are run using log data collected by a vehicle operating in an autonomous driving mode. The plurality of versions are run using the software to control a simulated vehicle. In addition, each of the plurality of versions has a set of timing requirements different from the set of timing requirements of other of the plurality of versions. At block 1320, results of the plurality of versions are compared to the log data. At block 1330, a realism metric defining timing requirements for one or more future simulations is generated based on the comparison.

The features described herein provide for a safe, effective, and realistic way of testing software for autonomous vehicles. For instance, the software can be tested in hundreds of thousands of scenarios numerous time without endangering the life and property of actual persons and at relatively little cost as compared to actual driving. Moreover, by using a realism metric as described here, the realism of the simulation is even greater and independent of the functionality of the server farm running the simulation. Without such testing, the risks of injury to persons or property using untested software may be too great.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of determining a realism metric for testing software for operating a vehicle in an autonomous driving mode, the method comprising:
running, by one or more processors of a server computing device, a plurality of versions of a simulation, the plurality of versions of the simulation generated based on log data collected by a given vehicle operating in a given autonomous driving mode over a period of time, wherein the plurality of versions are run using the software to control a simulated vehicle, and each of the plurality of versions has a set of timing requirements different from the set of timing requirements of other of the plurality of versions;
comparing, by the one or more processors, results of each of the plurality of versions to the log data to determine a subset of the plurality of versions for which a similarity threshold has been met between the results and the log data;
aggregating, by the one or more processors, the sets of timing requirements for the subset of the plurality of versions; and
generating, by the one or more processors, the realism metric for one or more future simulations based on the aggregated sets of timing requirements.

2. The method of claim 1, wherein determining the subset of the plurality of versions for which the similarity threshold has been met between the results and the log data is based on whether the simulated vehicle stays within a predetermined distance of a location of the vehicle in the log data for a threshold percentage of time.

3. The method of claim 2, wherein the threshold percentage of time is at least 99 percent.

4. The method of claim 2, wherein the predetermined distance is at least one meter.

5. The method of claim 1, wherein aggregating includes averaging the sets of timing requirements.

6. The method of claim 1, wherein when the comparison is determined to indicate that the similarity threshold has not been met for each version of the plurality of versions of the simulation, the simulation is flagged for review.

7. The method of claim 1, wherein the set of timing requirements includes a start time corresponding to a time in the log data at which a version of the simulation is started and an engage time corresponding to a time in the log data at which the software is given control of the simulated vehicle.

8. The method of claim 7, wherein the engage time is measured from the start time.

9. The method of claim 1, further comprising using the realism metric to run a second simulation different from the simulation.

10. The method of claim 1, further comprising, determining, for one version of the plurality of versions, a start time corresponding to a time in the log data at which the one version is started by adjusting an initial start time for the simulation to an earlier point in time in the log data, and wherein the start time is one of the set of timing requirements for the one version.

11. The method of claim 1, further comprising, determining, for one version of the plurality of versions, an engage time corresponding to a time in the log data at which the software is given control of the simulated vehicle by adjusting an initial start time for the simulation to an earlier point in time in the log data, and wherein the engage time is one of the set of timing requirements for the one version.

12. The method of claim 7, wherein the set of timing requirements further includes timing requirements for sending of messages by different modules of the software.

13. The method of claim 12, wherein the modules include a perception system, a planning system, and a control system.

14. The method of claim 7, wherein the set of timing requirements further includes timing requirements for simulated actuators of the simulated vehicle.

15. The method of claim 14, wherein the simulated actuators include controls for controlling acceleration, deceleration, or steering control of the simulated vehicle.

16. The method of claim 1, further comprising determining the sets of timing requirements using a uniform search over different possible values.

17. The method of claim 1, wherein at least one value of the set of timing requirements is consistent over two or more of the plurality of versions.

18. The method of claim 1, wherein the comparing includes comparing speed of the simulated vehicle with speed of the vehicle in the log data.

19. The method of claim 1, wherein the comparing includes comparing orientation of the simulated vehicle with orientation of the vehicle in the log data.

20. A system for determining a realism metric for testing software for operating a vehicles in an autonomous driving mode, the system comprising:
   one or more server computing devices having one or more processors, wherein the one or more processors are configured to:
   run, by one or more processors of a server computing device, a plurality of versions of a simulation, the plurality of versions of the simulation generated based on log data collected by a given vehicle operating in a given autonomous driving mode over a period of time, wherein the plurality of versions are run using the software to control a simulated vehicle, and each of the plurality of versions has a set of timing requirements different from the set of timing requirements of other of the plurality of versions;
   compare, by the one or more processors, results of each of the plurality of versions to the log data to determine a subset of the plurality of versions for which a similarity threshold has been met between the results and the log data;
   aggregate, by the one or more processors, the sets of timing requirements for the subset of the plurality of versions; and
   generate, by the one or more processors, the realism metric for one or more future simulations based on the aggregated sets of timing requirements.

* * * * *

UNITED STATES PATENT AND TRADEMARK OFFICE
CERTIFICATE OF CORRECTION

Page 1 of 1

PATENT NO. : 12,367,326 B1
APPLICATION NO. : 17/409935
DATED : July 22, 2025
INVENTOR(S) : Aleksandar Gabrovski, Yang-Hua Chu and James Stout It is certified that error appears in the above-identified patent and that said Letters Patent is hereby corrected as shown below:

In the Claims

Claim 20, Column 16, Line 17:
Now reads: "a vehicles" should read -- a vehicle --

Claim 20, Column 16, Lines 23 and 24:
Now reads: "run, by one or more processors of a server computing device," should read -- run --

Claim 20, Column 16, Line 32:
Now reads: "compare, by the one or more processors, results of each" should read -- compare results --

Claim 20, Column 16, Line 37:
Now reads: "aggregate, by the one or more processors," should read -- aggregate --

Claim 20, Column 16, Line 40:
Now reads: "generate, by the one or more processors," should read -- generate --

Signed and Sealed this
Ninth Day of September, 2025

Coke Morgan Stewart
*Acting Director of the United States Patent and Trademark Office*